(12) United States Patent
Mukai et al.

(10) Patent No.: US 8,427,885 B2
(45) Date of Patent: *Apr. 23, 2013

(54) NONVOLATILE SEMICONDUCTOR MEMORY DEVICE

(75) Inventors: Hideo Mukai, Tokyo (JP); Hiroshi Maejima, Kanagawa-ken (JP); Katsuaki Isobe, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/315,967

(22) Filed: Dec. 9, 2011

(65) Prior Publication Data

US 2012/0075916 A1    Mar. 29, 2012

Related U.S. Application Data

(63) Continuation of application No. 12/580,795, filed on Oct. 16, 2009, now Pat. No. 8,089,818.

(30) Foreign Application Priority Data

Oct. 17, 2008    (JP) ................................. 2008-268379

(51) Int. Cl.
*G11C 7/10* (2006.01)

(52) U.S. Cl.
USPC .......................... 365/189.05; 365/51; 365/148

(58) Field of Classification Search ............. 365/189.05, 365/51, 148
See application file for complete search history.

(56) References Cited

U.S. PATENT DOCUMENTS

| 7,095,644 B2 | 8/2006 | Chevallier et al. |
| 7,212,464 B2 | 5/2007 | Uehara et |
| 2008/0151656 A1 | 6/2008 | Nakai |

FOREIGN PATENT DOCUMENTS

| JP | 10-177797 | 6/1998 |
| JP | 2006-179158 | 7/2006 |
| JP | 2007-536680 | 12/2007 |

OTHER PUBLICATIONS

Notification of Reason for Refusal, dispatch date Oct. 2, 2012 issued in Japanese Application No. 2008-268379, filed Oct. 17, 2008, English translation only.

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A nonvolatile-semiconductor-memory-device including a cell array having a plurality of MATs (unit-cell-array) disposed in a matrix, the MATs each include a plurality of first lines, a plurality of second lines crossing the first lines, and memory cells being connected between the first and second lines. The device further includes a first and second drive circuit selecting the first and second lines connected to the memory cells of each MAT that are accessed, and driving the selected first and second lines to write or read data. The memory cells form a page by being connected to each first line selected from the MATs. The device also includes a data latch latching the write or the read data in units of pages, where the first and second drive circuit drive the first and second lines multiple times to write or read data for one page in and out of the cell array.

11 Claims, 12 Drawing Sheets

NONVOLATILE SEMICONDUCTOR MEMORY DEVICE

CROSS-REFERENCE TO RELATED APPLICATION

This application is a continuation of and claims the benefit under 35 U.S.C. §120 from U.S. application Ser. No. 12/580, 795, filed on Oct. 16, 2009, which claims priority under 35 U.S.C. §119 from Japanese Patent Application No. 2008-268379, filed on Oct. 17, 2008, the entire contents of which are incorporated herein by reference.

BACKGROUND OF THE INVENTION

The present invention relates to a nonvolatile semiconductor memory device in which a variable resistive element is used that stores resistance values as data. According to the present invention, a nonvolatile semiconductor memory device using a variable resistive element is provided that realizes the page operation of continuously reading and writing a large amount of data to ensure compatibility with NAND flash memories. As a conventional electrically rewritable nonvolatile memory, flash memory is known in which memory cells having a floating gate structure are NAND- or NOR-connected to form a cell array. Further, ferroelectric memory is known as a nonvolatile memory that enables high-speed random access.

Resistance-change memory that uses a variable resistive element for the memory cell has been proposed as the technique to achieve further miniaturization of the memory cell. Known examples of the variable resistive element include: a phase-change memory element in which the resistance value is varied by the crystalline/amorphous state change of chalcogenide compounds; an MRAM element that uses resistive changes caused by the tunnel magneto-resistance effect; a polymer ferroelectric RAM (PFRAM) memory element in which a conductive polymer is used to form the resistive element; and an ReRAM element that causes a resistive change by application of electrical pulses (see JP-A-2006-344349, paragraph 0021).

The resistance-change memory is advantageous because it can use memory cells formed by the series circuit of a schottky diode and a variable resistive element instead of a transistor, and therefore can be easily laminated to provide a three-dimensional structure and achieve higher integration (see JP-A-2005-522045).

The resistance-change memory is expected to be the successor to the flash memory, because it provides faster data access than the flash memory and offers higher capacity. From this perspective, it would be possible to utilize the currently available flash memory systems if the resistance-change memory could have the operation capability of the flash memory. This will reduce the cost of replacing the flash memory with the resistance-change memory in the development of new systems.

BRIEF SUMMARY OF THE INVENTION

A nonvolatile semiconductor memory device comprising: a cell array including a plurality of MATs (unit cell array) disposed in a matrix, the MATs each including a plurality of first lines, a plurality of second lines crossing the first lines, and memory cells which include a variable resistive element, the memory cells being connected between the first and second lines at intersections of the first and second lines, capable of electrical rewriting, and adapted to store a resistance value as data in a nonvolatile manner; a data latch provided to hold write data for the memory cells of each MAT, or read data from the memory cells; and a first and a second drive circuit provided to select the first and second lines connected to the memory cells of each MAT that are to be accessed, and to drive the selected first and second lines therebetween to write or read the data, the memory cells forming a page by being connected to each first line selected from the MATs, the data latch latching the write data or the read data in units of pages, and the first drive circuit and the second drive circuit driving the first and second lines multiple times to write or read data for one page in and out of the cell array.

DETAILED DESCRIPTION OF THE INVENTION

First Embodiment

Figure 1:
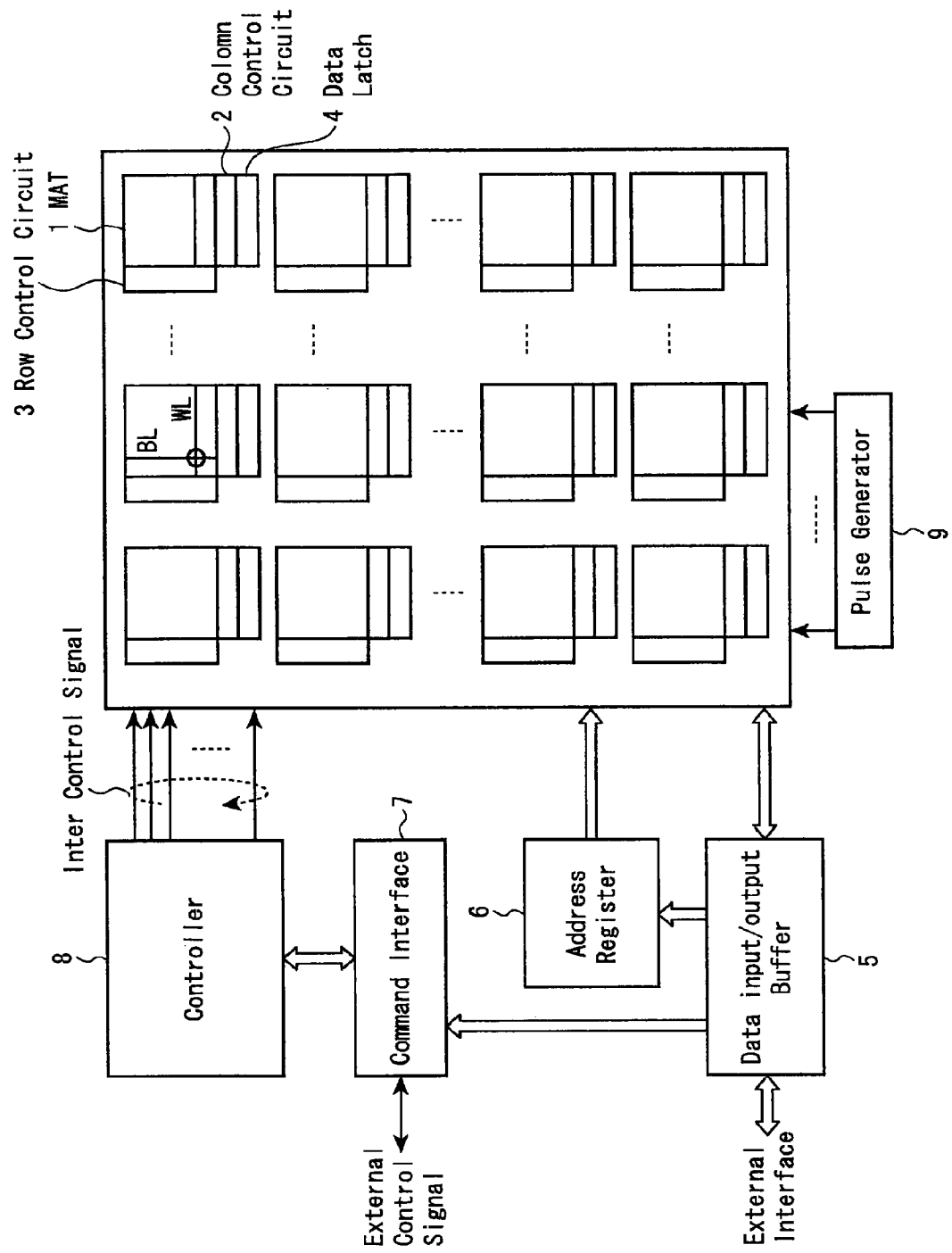
FIG. 1 is a block diagram of a nonvolatile memory according to the First Embodiment of the present invention.

FIG. 1 is a block diagram of a nonvolatile memory according to the First Embodiment of the present invention.

The nonvolatile memory includes a plurality of MATs (unit cell array) 1 disposed in a matrix manner, and that uses a resistance-change element such as an ReRAM (variable resistive element; described later) as the memory cell. The nonvolatile memory also includes a column control circuit 2 and a row control circuit 3, which are first and second drive circuits, respectively, connected to each MAT 1. The column control circuit 2 controls a bit line BL, a second line of the MAT 1, to erase, write, and read data with respect to the memory cell. The row control circuit 3 selects a word line WL, a first line of the MAT 1, and applies a voltage required for the erasing, writing, and reading of data with respect to the memory cell. Each MAT 1 is provided with a data latch 4, which holds data to be written into the memory cell, or data read out from the memory cell. The data latch 4 holds write data, and the column control circuit 2 and the row control circuit 3 supply predetermined voltages to the bit line and the word line, respectively, based on the data held in the data latch 4. The data latch 4 also holds data from the memory cell selected by the column control circuit 2 and the row control circuit 3.

A data input/output buffer 5 is connected to an external host (not shown) via an I/O line to receive write data and an erase command, output read data, and receive address data and command data.

The data input/output buffer 5 sends the received input data to the data latch 4, and receives and outputs the data read from the data latch 4. The externally supplied address to the data input/output buffer 5 is sent to the column control circuit 2 and the row control circuit 3 via an address register 6. The command supplied to the data input/output buffer 5 from the host is sent to a command interface 7. Upon receipt of the external control signal from the host, the command interface 7 determines whether the data input to the data input/output buffer 5 is write data, a command, or an address. If it is a command, the command interface 7 receives the data and transfers it to a controller 8 as a command signal. The controller 8 administers the whole nonvolatile memory, administering operations such as reading, writing, erasing, and input/output of data in response to the received command from the host. The external host may be adapted to determine operation results based on the received status information administered by the controller 8. The status information is also used for the control of writing and erasing.

The controller 8 controls a pulse generator 9. The control enables the pulse generator 9 to output pulses of arbitrary voltages at any arbitrary timings. The generated pulses may be transferred to any lines selected by the column control circuit 2 and the row control circuit 3.

Peripheral circuit elements other than MAT 1 may be formed on a Si substrate directly below the MATs 1 formed on a wiring layer. In this way, the chip area of the nonvolatile memory can substantially match the total area of the MATs 1.

Figure 2:
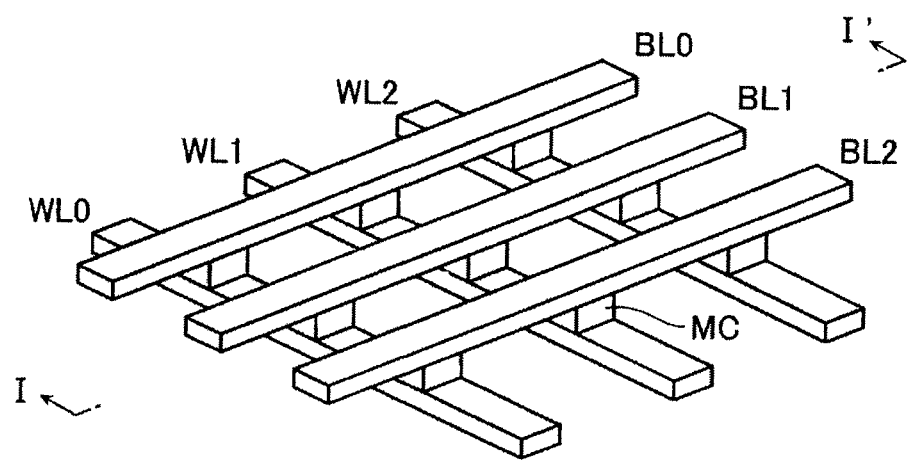
FIG. 2 is a partial perspective view of an MAT of the nonvolatile memory according to the First Embodiment.

FIG. 2 is a partial perspective view of MAT 1. A plurality of word lines WL0 to WL2 is disposed in parallel to cross a plurality of bit lines BL0 to BL2 also disposed in parallel. The memory cell MC is disposed between these lines at each intersection. The word line WL and the bit line BL are preferably made of material that withstands heat and has a low resistance value, for example, such as W, WSi, NiSi, and CoSi.

Figure 3:
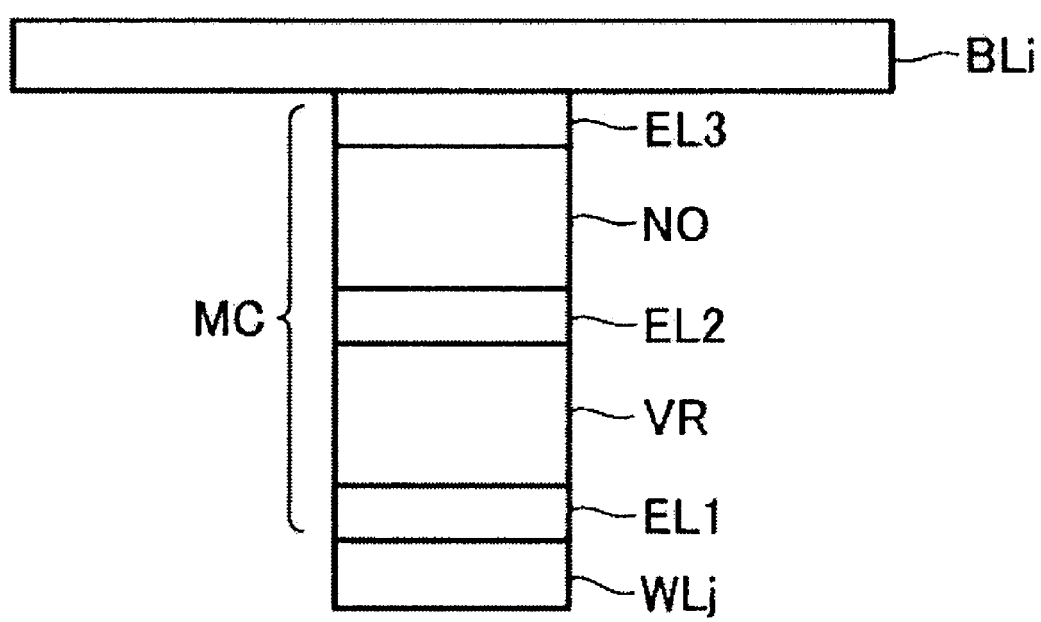
FIG. 3 is a cross sectional view of one of the memory cells, taken along the line I-I' of FIG. 2 and as viewed in the direction of arrow.

FIG. 3 is a cross sectional view of one of the memory cells, taken along the line I-I' of FIG. 2 and as viewed in the direction of arrow. As represented in FIG. 3, the memory cell MC is realized by a series connection circuit including a variable resistive element VR and a non-ohmic element NO.

The variable resistive element VR may be such that the resistance value varies through, for example, current, heat, and chemical energy in response to applied voltage. On the both sides of the variable resistive element VR are electrodes EL1 and EL2 which serve as barrier metal and bonding layers. Examples of electrode material include Pt, Au, Ag, TiAlN, SrRuO, Ru, RuN, Ir, Co, Ti, TiN, TaN, LaNiO, Al, PtIrOx, PtRhOx, Rh, and TaAlN. Metal films to achieve uniform orientation may be additionally inserted. Further, insertion of other layers, such as a buffer layer, a barrier metal layer, and a bonding layer is also possible.

The variable resistive element VR may be of a type in which a change in resistance value is achieved by, for example, the phase transition between crystalline state and amorphous state as in chalcogenide (PCRAM); the formation of a bridge (contacting bridge) between the electrodes through deposition of metal cations, or destruction of the bridge through ionization of the deposited metal (CBRAM); or application of voltage or current (ReRAM), though the resistive change in ReRAM lacks an agreed theory. (Broadly, two theories exist: one positing the presence or absence of trapped charges in the charge trap that exists at the electrode interface, and one positing the presence or absence of a conductive path attributed to factors such as oxygen deficiency.)

Figure 4:
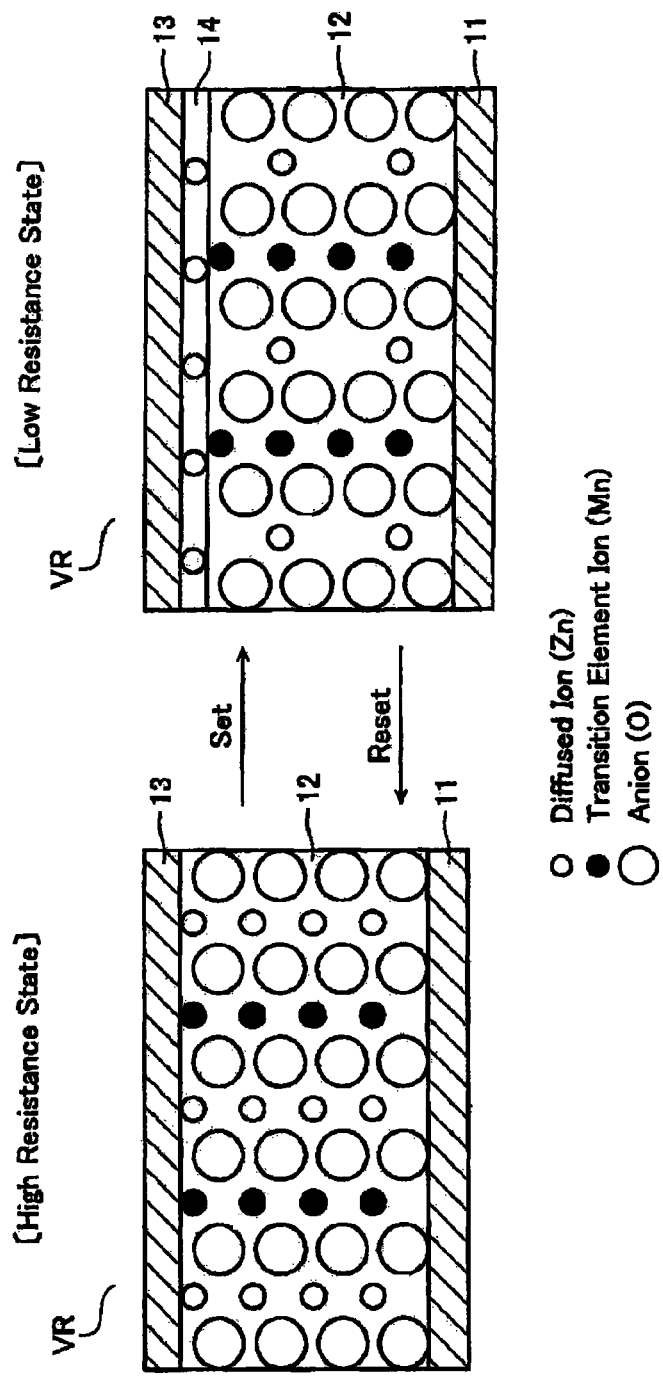
FIG. 4 is a schematic cross sectional view depicting an example of a variable resistive element according to the First Embodiment.

FIG. 4 depicts an example of ReRAM. The variable resistive element VR shown in FIG. 4 includes electrode layers 11 and 13, and a storage layer 12 disposed therebetween. The storage layer 12 is formed of a complex compound including at least two kinds of cationic elements. At least one kind of cationic element is a transition element having a d-orbital incompletely filled with electrons, and the shortest distance between adjacent cationic elements is 0.32 nm or less. Specifically, the storage layer 12 is represented by the chemical formula AxMyXz (A and M are different elements), and made of a material having a crystalline structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($AxMO_2$), a ramsdellite structure ($AxMO_2$), and a perovskite structure ($AMO_3$).

In the example of FIG. 4, A is Zn, M is Mn, and X is O. In the storage layer 12, the small open circle, the large open circle, and the small solid circle represent a diffuse ion (Zn), an anion (O), and a transition element ion (Mn), respectively. Initially, the storage layer 12 is in the high-resistance state. With the electrode layer 11 at a fixed potential, applying a negative voltage to the electrode layer 13 side causes some of the diffuse ions in the storage layer 12 to migrate toward the electrode layer 13, and as a result the diffuse ions in the storage layer 12 decrease in number relative to the anions. The diffuse ions moved to the electrode layer 13 side receive electrons from the electrode layer 13, and deposit as metal to form a metalization layer 14. In the storage layer 12, anions are in excess, raising the lower layer of the transition element ions in the storage layer 12. As a result, the storage layer 12 becomes electronically conductive by the carrier injection, thus completing the set operation. For reproduction, a current is flown that is small enough not to cause a resistive change in the material forming the storage layer 12. The programmed state (low-resistance state) can be reset to the initial state (high-resistance state) by, for example, flowing a large current to the storage layer 12 for a sufficient time period to cause Joule heating and promote a redox reaction in the storage layer 12. The reset operation can also be performed by application of an electric field of the opposite direction relative to that used in the set operation.

The non-ohmic element NO is realized by, for example, various diodes such as a schottky diode, a PN-junction diode, and a PIN diode, or by structures such as an MIM (Metal-Insulator-Metal) structure, and an SIS (Silicon-Insulator-Silicon) structure. Electrodes EL2 and EL3 forming barrier metal layers and bonding layers may be inserted. When using diodes, unipolar operation may be performed by taking advantage of their characteristics. Bipolar operation is possible with structures such as an MIM structure and an SIS structure. The positions of the non-ohmic element NO and the variable resistive element VR may be reversed from that shown in FIG. 3. Further, the polarity of the non-ohmic element NO may be reversed.

Note that, in the following, data is "1" when the resistance state of the variable resistive element VR is in the high-resistance state, and "0" when in the low-resistance state.

Further, the write operation or set operation is also referred to as a "0" write operation, and the erase operation or reset operation as a "1" write operation.

Figure 5:
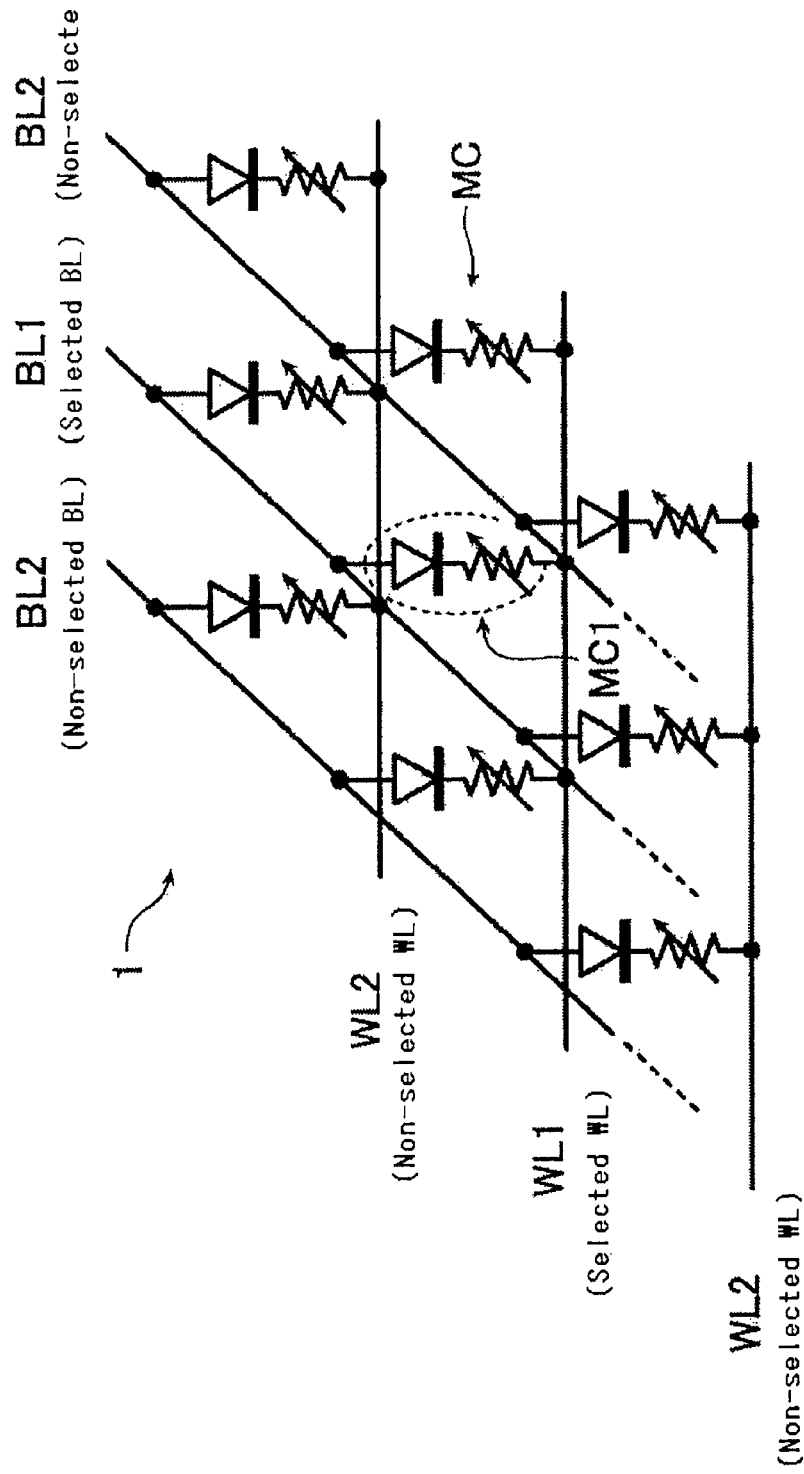
FIG. 5 is a partial circuit diagram of an MAT according to the First Embodiment.

FIG. 5 is a partial circuit diagram of MAT 1.

The MAT 1 includes a plurality of word lines WL, and a plurality of bit lines BL crossing the word lines WL. The memory cell MC realized by a diode Di (the non-ohmic element NO whose anode is connected to the bit line BL) and the variable resistive element VR connected between the cathode of the diode Di and the word line WL is connected at each intersection of the word lines WL and the bit lines BL. The MAT 1 can have any size, and can be decided in consideration of such factors as a voltage drop of the word lines WL and bit lines BL, CR delay, and the processing speed of the data write operation.

The data write operation of this embodiment is described below.

First, as a prerequisite for the page operation that handles a large amount of data at once, the following describes the "1" write operation and the "0" write operation for the memory cell MC1 enclosed by the dotted line in FIG. 5.

Figure 6A:
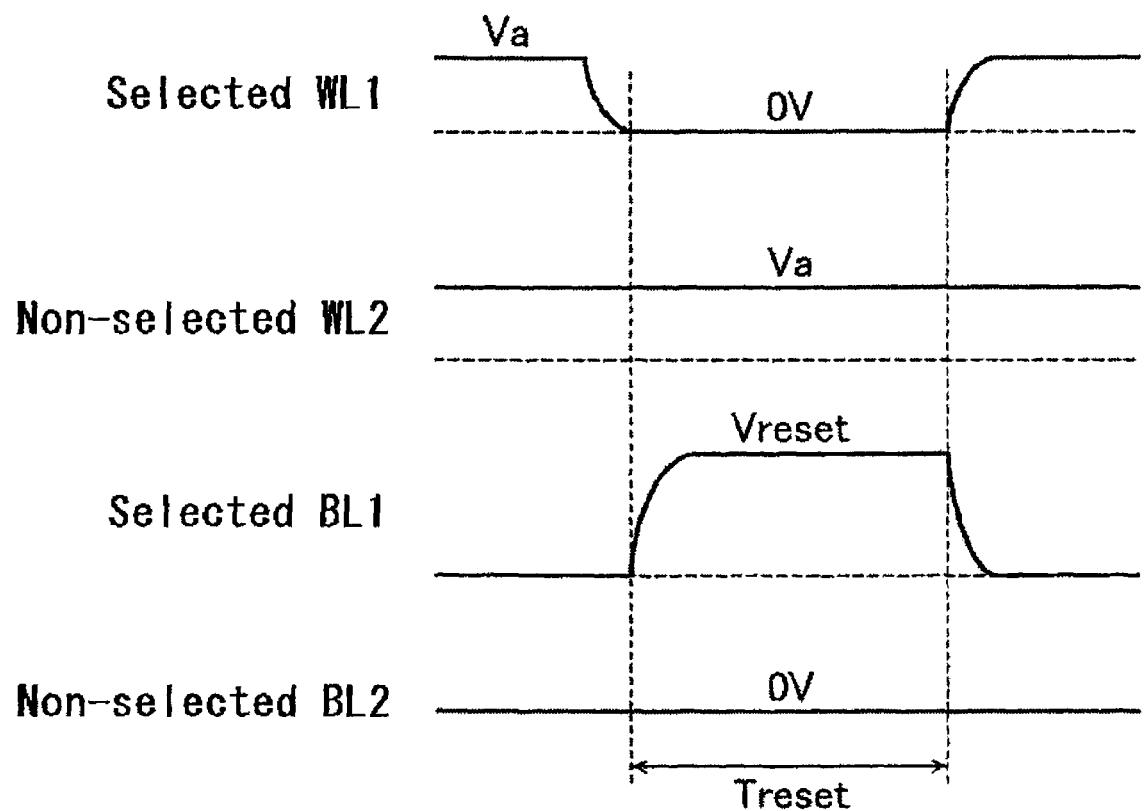
FIG. 6A is an operation waveform chart for word lines WL and bit lines BL during a "1" write operation according to the First Embodiment.

FIG. 6A represents operation waveforms of the word lines WL and the bit lines BL during the "1" write operation. Under normal conditions, all the word lines WL are at a predetermined positive voltage Va, and all the bit lines BL have a ground level voltage (0 V). Here, the diode Di of each memory cell MC is reverse biased, and no voltage is applied to the memory cell MC.

From this state, the selected word line WL1 connected to the memory cell MC1 is brought down to the ground level voltage (0 V) for a predetermined time period Treset, and subsequently a reset voltage Vreset is supplied to the selected bit line BL1. The other non-selected word lines WL2 and non-selected bit lines BL2 are maintained at a ground level voltage (0 V) as in normal conditions. As a result, the diode Di of the memory cell MC1 is forward biased, and the variable resistive element VR makes a transition to the high-resistance state. The other memory cells MC are not biased so that there is no transition in the resistance state of the variable resistive element VR. As a result of this operation, a "1" is written into only the memory cell MC1. Note that the predetermined time period Treset must be sufficiently long for a redox reaction to occur by the Joule heating of the variable resistive element, as described above with reference to FIG. 4.

Figure 6B:
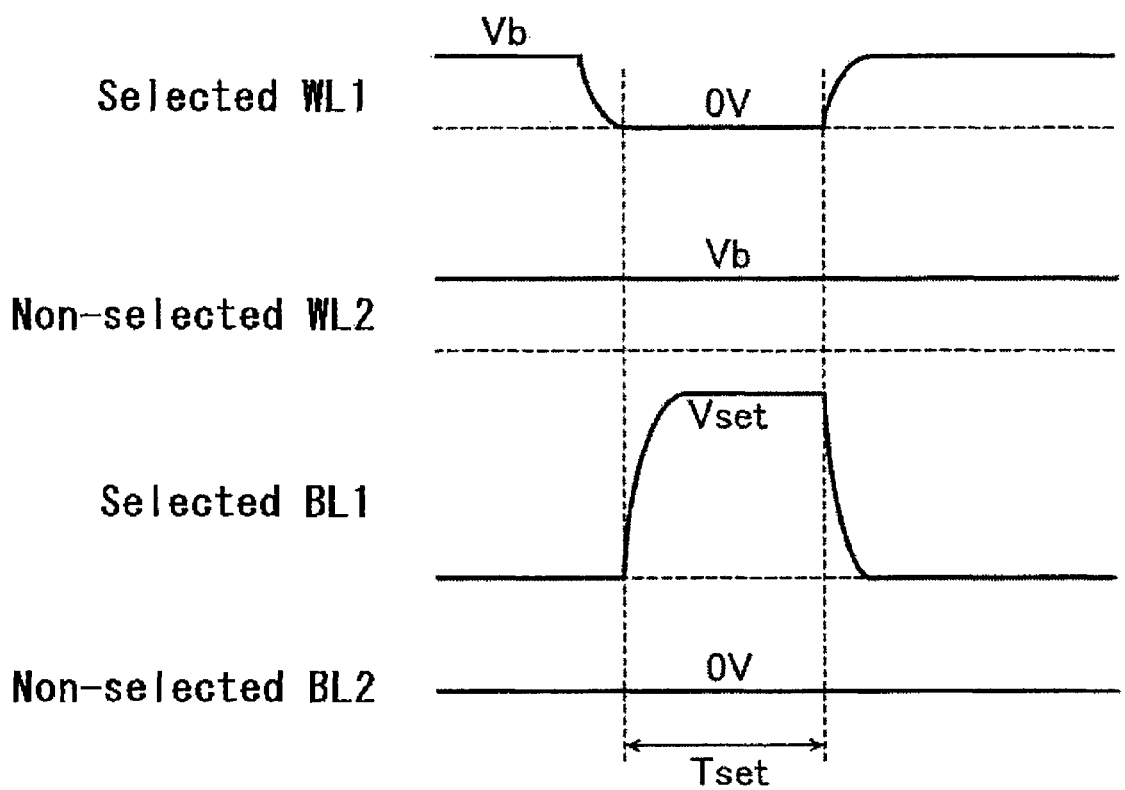
FIG. 6B is an operation waveform chart for word lines WL and bit lines BL during a "0" write operation according to the First Embodiment.

FIG. 6B represents operation waveforms of the word lines WL and bit lines BL during the "0" write operation. Under normal conditions, all the word lines WL are at a predetermined positive voltage Vb, and all the bit lines BL have a ground level voltage (0 V). Here, the diode Di of each memory cell MC is reverse biased, and no voltage is applied to the memory cell MC.

From this state, the selected word line WL1 connected to the memory cell MC1 is brought down to the ground level voltage (0 V) for a predetermined time period Tset relatively shorter than Treset, and subsequently a set voltage Vset greater than the reset voltage Vreset is supplied to the selected bit line BL1. The other non-selected word lines WL2 and non-selected bit lines BL2 are maintained at the same voltage applied under normal conditions. As a result, the diode Di of the memory cell MC1 is forward biased, and the variable resistive element VR makes a transition to the low-resistance state. The other memory cells MC are not biased so that there is no transition in the resistance state of the variable resistive element VR. As a result of this operation, a "0" is written into only the memory cell MC1.

The following describes the page operation that handles a large amount of data at once.

Figure 7:
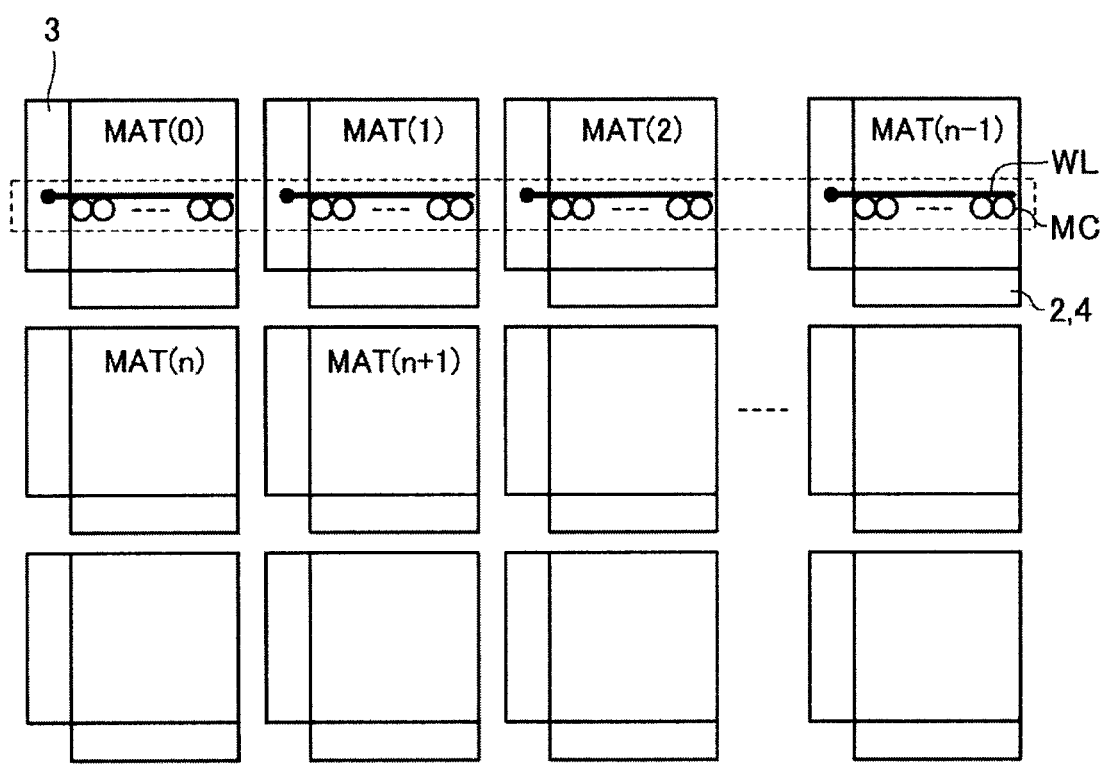
FIG. 7 is a schematic diagram illustrating a page structure according to the First Embodiment.

FIG. 7 is a schematic diagram depicting a page structure of the present embodiment. The cell array includes MAT(0) to MAT(n−1) disposed along the row direction, and n MATs are disposed along the column direction.

A plurality of memory cells MC is connected to plural word lines WL of each MAT. As described above, each MAT includes the column control circuit 2, the row control circuit 3, and the data latch 4. In FIG. 7, the bit lines BL of each MAT are omitted for simplicity. Further, the column control circuit 2 and the data latch 4 are depicted as a single element.

Referring to FIG. 7, a page is structured by a plurality of memory cells MC enclosed by the dotted lines. Specifically, a plurality of memory cells MC connected to a predetermined one of the plural word lines WL of the MAT(0) to MAT(n−1) forms one page. Accordingly, when the number of memory cells MC connected to each word line WL is m, the number of memory cells in one page is m×n.

For data writing, externally supplied write data for one page is held by the data latch 4 of each MAT via the data input/output buffer 5. Here, the write data is transferred by being automatically sorted into the data latches 4 of predetermined MATs forming the designated page, according to an externally supplied page address. Then, in each MAT, the data held in the data latch 4 is written into the predetermined memory cells MC forming the page. Here, since there is a limit in the number of memory cells MC that can be written at the same time in each MAT, it is not always possible to simultaneously write data for one page. This can be overcome by dividing the held data in the data latch 4 into portions, and serially writing these data to a predetermined number of memory cells that can be written at the same time. Even though the write data for the memory cells MC is divided into portions, the write data for one page can be externally supplied to the nonvolatile memory without being divided. Further, since the designation of a page address is required only once, it is possible to ensure compatibility with the NAND flash memory that operates to perform a page operation. This completes data writing for one page. It is not required to provide the data latch 4 independently for each MAT, and the data latch 4 may be shared by more than one MAT.

In the conventional NAND flash memory having a large cell array of a gigabit unit, selecting a single word line enables simultaneous access to the page of large numbers of memory cells connected to the selected word line. However, in memory cells using the variable resistive element, rewriting of data is performed by flowing a large current to the memory cells. Thus, when simultaneously accessing larger numbers of memory cells, a voltage drop in the word lines and the bit lines may prevent rewriting of desired data.

Such an influence of voltage drop in the word lines WL and the bit lines BL can be reduced by serially writing the write data for one page in portions as in this embodiment. Further, the high speed write time can be achieved by dividing the cell array into a plurality of MATs and operating these MATs in parallel.

The data read operation of the present embodiment is described below.

The data read operation is the reverse of the data write operation. Specifically, in each MAT, the memory cells MC forming a page transfer data to the data latch 4, which then holds the read data for one page. The data for one page held in the data latch 4 is then transferred to the data input/output buffer 5. Reading of data for one page is enabled by this series of operation.

As described above, according to the present embodiment, a nonvolatile semiconductor memory device using a variable resistive element is provided that realizes the page operation of continuously reading and writing a large amount of data to ensure compatibility with NAND flash memories.

Second Embodiment

Figure 8:
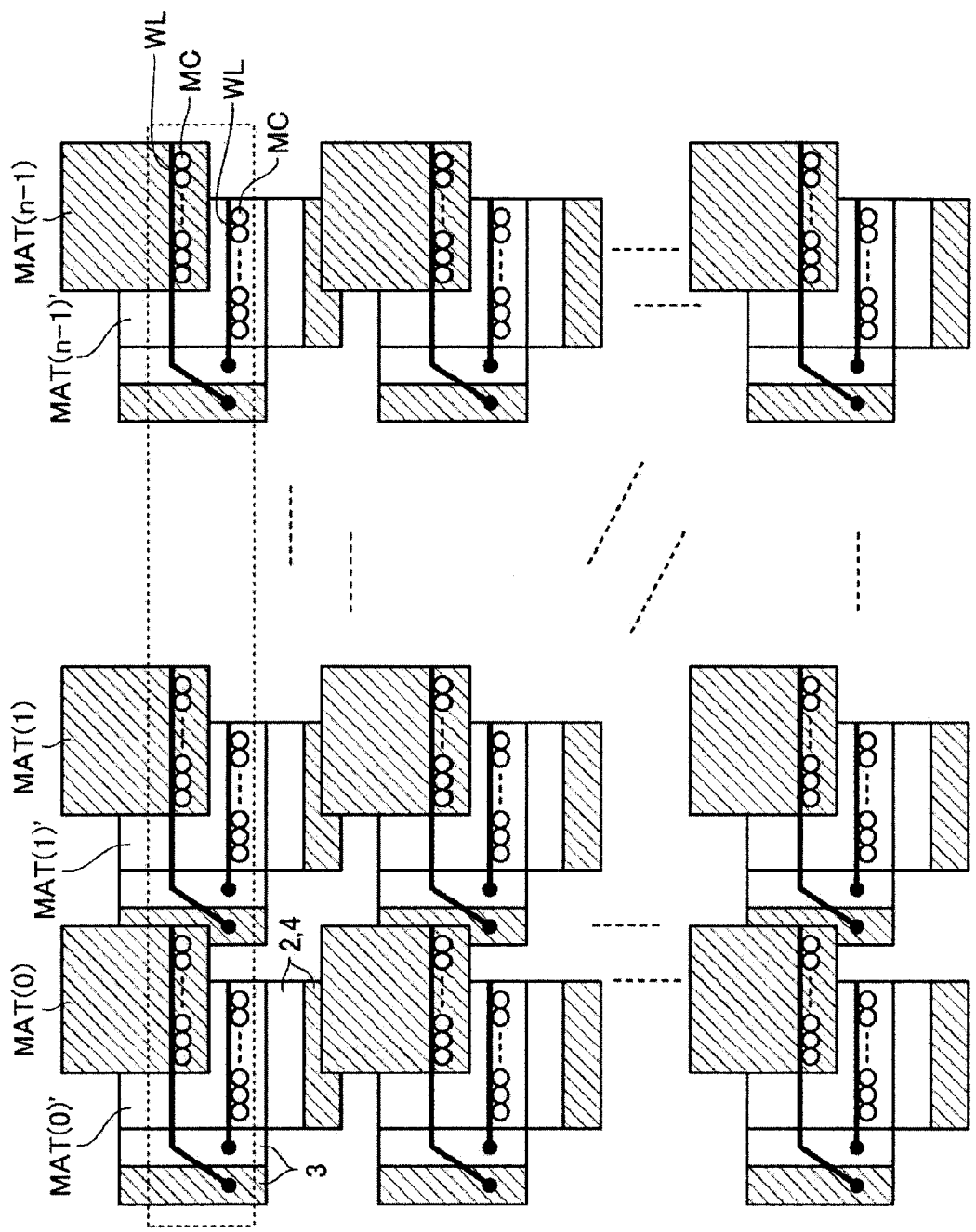
FIG. 8 is a schematic diagram illustrating a page structure of a nonvolatile memory according to the Second Embodiment of the present invention.

FIG. 8 is a schematic diagram illustrating a page structure of a nonvolatile semiconductor memory device according to the Second Embodiment of the present invention. In FIG. 8, the bit lines BL of each MAT are omitted for simplicity. Further, the column control circuit 2 and the data latch 4 are depicted as a single element.

The cell array has a bilayer laminate structure. In FIG. 8, the shaded elements are upper layer MATs and their peripheral circuits. The other elements are lower layer MATs and their peripheral circuits.

Each layer is divided into MATs disposed in a matrix, as in the First Embodiment. MAT(0) to MAT(n−1) are disposed along the row direction of the upper layer. MAT(0)' to MAT(n−1)' are disposed along the row direction of the lower layer. A page is formed by a plurality of memory cells MC connected to single word lines WL of the MAT(0) to MAT(n−1) and MAT(0)' to MAT(n−1)', as indicated by dotted lines in FIG. 8.

In the cell array having a laminate structure as in the present embodiment, the MATs to which the memory cells of one page belong may be of different layers. The page operation similar to that of the NAND flash memory can also be realized in this manner.

Note that the present embodiment, described above based on an exemplary cell array of a bilayer structure, is also applicable to a cell array having a multilayer structure of three or more layers.

Third Embodiment

The Third Embodiment of the present invention relates to a cell array having a laminate structure as in the Second Embodiment.

As described above, the peripheral circuits such as the row control circuit, the column control circuit, and the data latch of each MAT are formed on the Si substrate directly below the MATs of the lowermost layer. The wires provided for each layer are connected to the peripheral circuits via contacts that extend in the laminate direction of the cell array. Because the contacts connected to the wires of the upper layer must be disposed to avoid the contacts connecting the lower layer wires and the peripheral circuits, longer wires are required for the upper layer. However, this enables the MATs of the upper layer to provide larger numbers of cell arrays.

The present embodiment concerns a page structure of the cell array in which the size of MAT varies between different layers.

Figure 9:
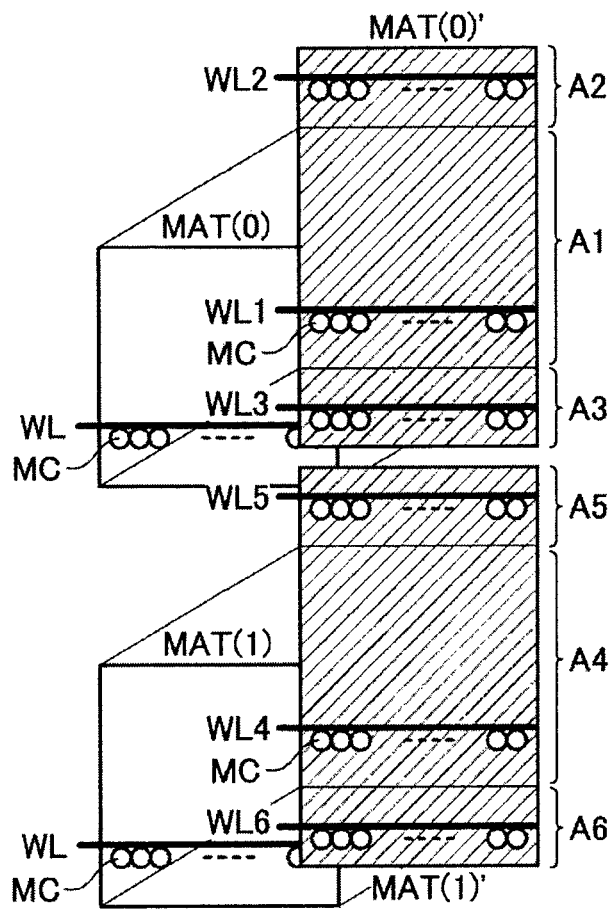
FIG. 9 is a schematic diagram illustrating a page structure of a nonvolatile memory according to the Third Embodiment of the present invention.

FIG. 9 is a schematic diagram illustrating a page structure of the present embodiment. The row control circuit, the column control circuit, and the data latch are omitted for simplicity. The memory cell array has a bilayer laminate structure. In FIG. 9, the shaded elements are upper layer MATs. The other elements are lower layer MATs and their peripheral circuits.

The lower layer includes MAT(0) and MAT(1), and the upper layer includes MAT(0)' and MAT(1)' disposed directly above MAT(0) and MAT(1), respectively. MAT(0)' is longer than MAT(0) along the column direction. The region directly above MAT(0) is A1, and the regions in contact with the both sides of region A1 in the column direction are A2 and A3. Likewise, MAT(1)' is longer than MAT(1) along the column direction. The region directly above MAT(1) is A4, and the regions in contact with the both sides of region A4 in the column direction are A5 and A6.

Regions A1 and A4 have the same number of word lines WL as MAT(0) and MAT(1). As such, as in the Second Embodiment, a page is formed by a plurality of memory cells connected to the word line WL1 of region A1 and to a predetermined word line WL of MAT(0)'. In this case, the word lines WL in regions A2 and A3 of MAT(0)' and the word lines WL in regions A5 and A6 of MAT(1)' in the upper layer cannot be combined with the word lines WL of the lower layer MAT(0) and MAT(1) to form a page structure. Thus, for example, the memory cells connected to the word line WL3 in region A3 of the upper layer MAT(0)', and the memory cells connected to the word line WL5 in region A5 of MAT(1)' are used to form one page. Similarly, the memory cells connected to the word line WL2 in region A2 of the upper layer MAT(0)', and the memory cells connected to the word line WL6 in region A6 of MAT(1)' are used to form one page.

In this manner, the present embodiment enables all the memory cells to be organized in units of pages, even though the cell array includes MATs of different sizes for different layers. The page operation can also be realized in this way, as in the First and Second Embodiments.

Note that the present embodiment, described above based on an exemplary cell array of a bilayer structure, is also applicable to a cell array having a multilayer structure of three or more layers.

Fourth Embodiment

Figure 10:
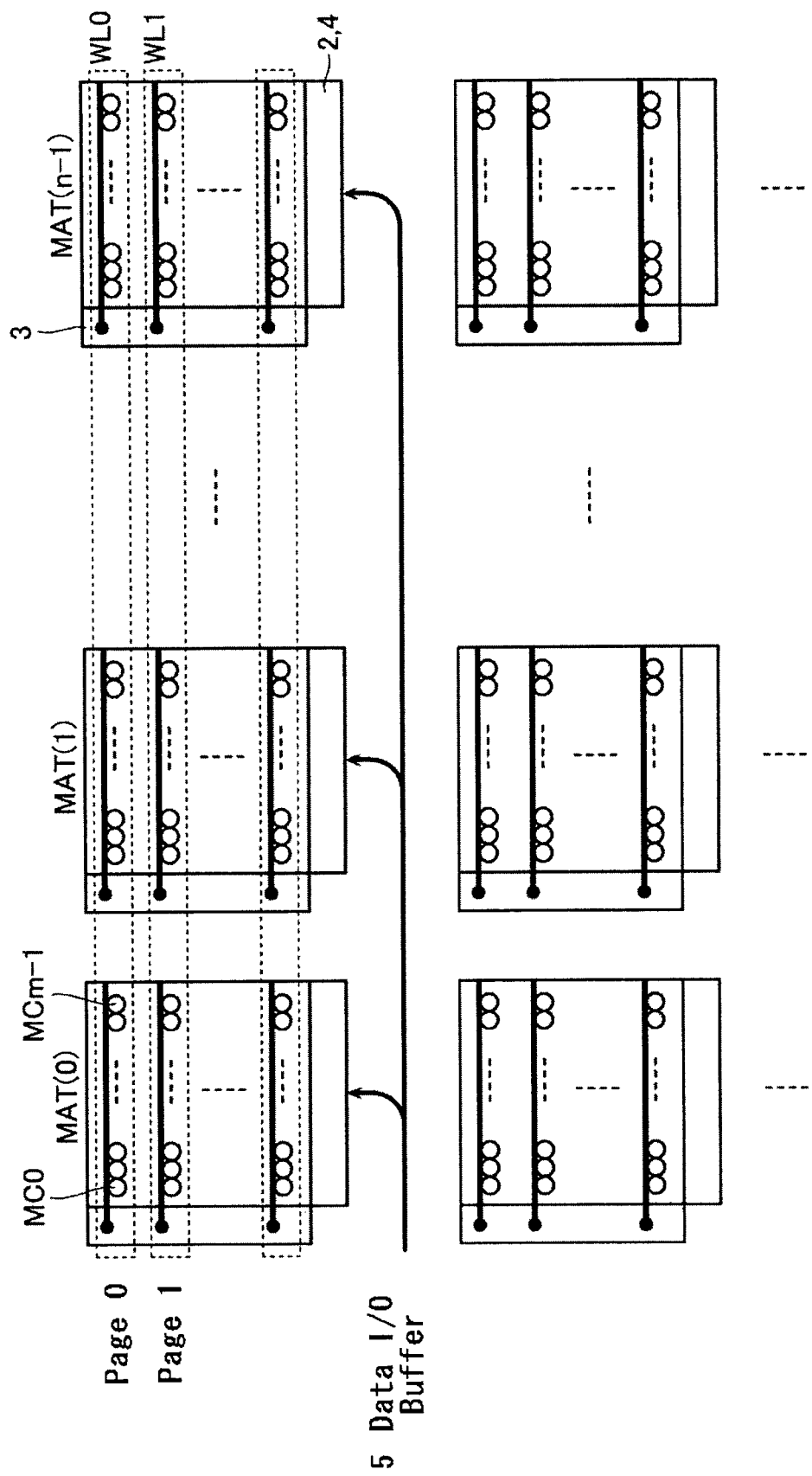
FIG. 10 is a schematic diagram representing a write operation of a nonvolatile memory according to the Fourth Embodiment of the present invention.
Figure 11:
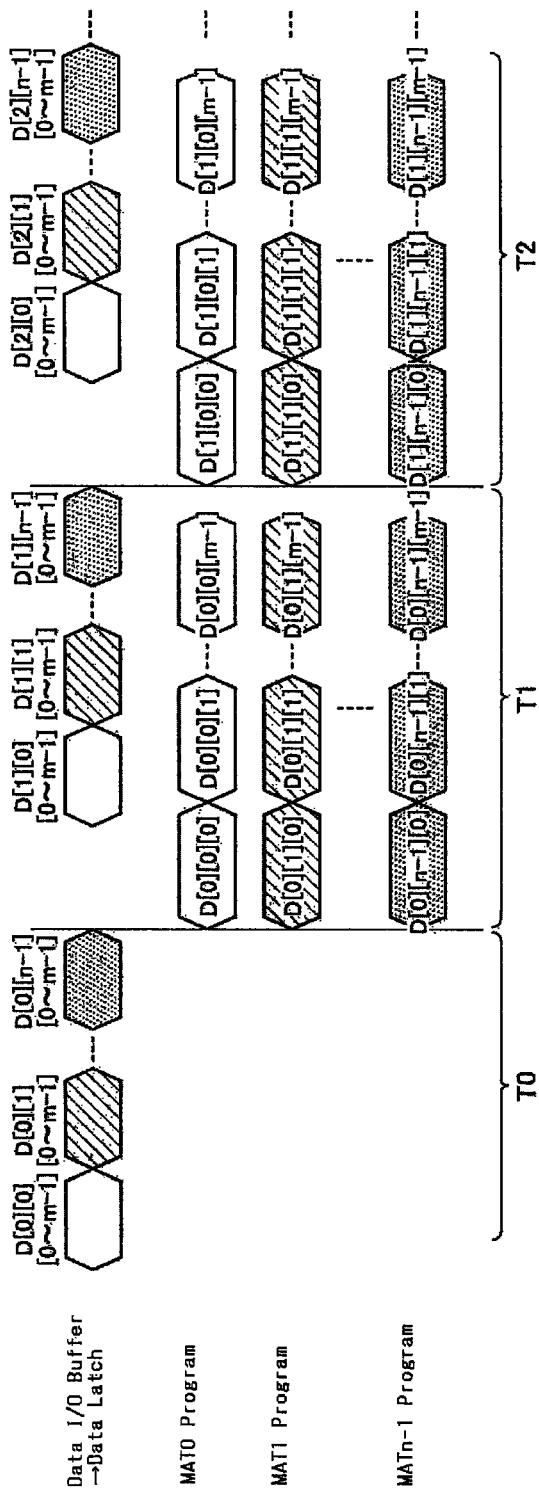
FIG. 11 is a timing chart for data writing according to the Fourth Embodiment.

FIG. 10 is a schematic diagram representing the write operation of a nonvolatile memory according to the Fourth Embodiment of the present invention. FIG. 11 is a timing chart of the write operation of FIG. 10. In FIG. 11, D[i] [j] [k] represents write data to memory cells MCk of MAT(j) that belongs to page i of FIG. 10.

As illustrated in FIG. 10, the cell array of the present embodiment includes n MATs, MAT(0) to MAT(n−1), disposed along the row direction. A page is formed by a combination of the respective single word lines WL of MAT(0) to MAT(n−1). For example, page 0 is formed by a plurality of memory cells MC connected to the respective word lines WL0 of MAT(0) to MAT(n−1).

In this embodiment, holding of data by the data latch 4, and writing of the data into the memory cells MC are carried out by a pipeline process for the cell array of the foregoing structure.

At time T0 in FIG. 11, write data for the memory cells MC of page 0 is transferred from the data input/output buffer 5 to the data latch 4 of each MAT. The data transfer from the data input/output buffer 5 to the data latch 4 proceeds on an MAT basis, beginning with, for example, the write data D[0] [0] [0] to D[0] [0] [m−1] for the memory cells MC0 to MCm−1 of MAT(0), followed by the write data D[0] [1] [0] to D[0] [1] [m−1] for the memory cells MC0 to MCm−1 of MAT(1).

Next, at time T1, the write data held in the data latch 4 at time T0 is written into the memory cells MC. Writing of the data proceeds by, for example, writing write data D[0] [0] [0] to D[0] [n−1] [0] to each memory cell MC0 of MAT(0) to MAT(n−1) in parallel, and then writing write data D[0] [0] [1] to D[0] [n−1] [1] to each memory cell MC1 of MAT(0) to MAT(n−1) in parallel. This operation is repeated sequentially for the memory cells MC2 to MCm−1 to complete the writing of data for one page.

At time T1, concurrently with the data writing to the memory cells MC, the write data D[1] [0] [0] to D[1] [0] [m−1], D[1] [1] [0] to D[1] [1] [m−1], and so on for the next page (page 1) are transferred to the data latch 4 of each MAT.

Next, at time T2, the write data for the next page (page 2) are transferred to the data latch 4 of each MAT from the data input/output buffer 5, concurrently with the writing of the page-1 data, previously transferred to the data latch 4 of each MAT at time T1, into the memory cells MC of page 1.

This operation is repeated to complete the writing of data for a plurality of pages.

A data reading process proceeds in the same fashion by first holding the data for the memory cells MC of the first page in the data latch 4. Then, the first-page read data held in the data latch 4 is transferred to the data input/output buffer 5, and, at the same time, the data for the memory cells MC of the next page are held in the data latch 4. This is repeated to complete the reading of data for a plurality of pages.

The present embodiment realizes the page operation needed to ensure compatibility with the NAND flash memory or the like, as in the First Embodiment. Further, because the sending and receiving of data between the data input/output buffer 5 and the data latch 4, and the reading and writing of data between the memory cells MC and the data latch 4 are performed by a pipeline process, reading and writing of data for a plurality of pages can be performed at high speed.

What is claimed is:

1. A nonvolatile semiconductor memory device comprising:
    a cell array including a first MAT including a first layer and a second layer, and the first layer and the second layer including a plurality of first lines, a plurality of second lines crossing the first lines, and memory cells which include a variable resistive element, the memory cells being connected between the first and second lines at intersections of the first and second lines, capable of electrical rewriting, and adapted to store a resistance value as data;
    a data latch provided to store write data for the memory cells, or read data from the memory cells; and
    a first drive circuit provided to select the first and second lines connected to the memory cells of the first and second layers that are to be accessed, and to drive the selected first and second lines therebetween to write or read the data,
    the memory cells forming a page by being connected to each first line selected from the first and second layers,
    the data latch storing the write data or the read data in units of pages, and
    the first drive circuit driving the first and second lines to write or read data for one page in and out of the cell array.

2. A nonvolatile semiconductor memory device according to claim 1, wherein the one page belongs the first and second layers.

3. A nonvolatile semiconductor memory device according to claim 1, wherein the first layer and the second layer is disposed on different layer.

4. A nonvolatile semiconductor memory device according to claim 1, wherein the first layer and the second layer have the same number of the plurality of first lines.

5. A nonvolatile semiconductor memory device according to claim 1, wherein a size of the first layer is larger than that of the second layer.

6. A nonvolatile semiconductor memory device according to claim 5 wherein the first layer includes a first part and a second part, and
    the number of the plurality of first lines in the first part of the first layer is equal to that in the second layer.

7. A nonvolatile semiconductor memory device according to claim 5 wherein the first layer includes a first part and a second part, and
    the number of the plurality of first lines in the second part of the first layer is smaller than that in the second layer.

8. A nonvolatile semiconductor memory device according to claim 7, further comprising, a cell array including a second MAT, and
    wherein the second part of the first layer in the first MAT is adjacent to a second part of the first layer in the second MAT.

9. A nonvolatile semiconductor memory device according to claim 8, wherein the plurality of first lines in the second part of the first layer in the first MAT and the plurality of first lines in the second part of the first layer in the second MAT form the one page.

10. A nonvolatile semiconductor memory device according to claim 6, wherein the plurality of first lines in the first layer and the plurality of first lines in the second layer form the one page.

11. A nonvolatile semiconductor memory device according to claim 1, wherein the first drive circuit driving the first and second lines multiple times to write or read data for the one page in and out of the cell array.

* * * * *